United States Patent
Liu et al.

(10) Patent No.: US 11,817,441 B2
(45) Date of Patent: Nov. 14, 2023

(54) DISPLAY PANEL AND DISPLAY DEVICE

(71) Applicant: Shanghai Tianma Micro-Electronics Co., Ltd., Shanghai (CN)

(72) Inventors: Cao Liu, Shanghai (CN); Yingying Chen, Shanghai (CN); Xiaoli Liu, Shanghai (CN); Sitao Huo, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/835,365

(22) Filed: Jun. 8, 2022

(65) Prior Publication Data

US 2023/0317695 A1 Oct. 5, 2023

(30) Foreign Application Priority Data

Mar. 31, 2022 (CN) .......................... 202210330447.X

(51) Int. Cl.
| | |
|---|---|
| *H01L 25/16* | (2023.01) |
| *G09G 3/32* | (2016.01) |
| *H10K 59/121* | (2023.01) |
| *H01L 27/12* | (2006.01) |
| *H10K 59/35* | (2023.01) |

(52) U.S. Cl.
CPC ............. *H01L 25/167* (2013.01); *G09G 3/32* (2013.01); *H10K 59/1213* (2023.02); *G09G 2300/0426* (2013.01); *G09G 2300/0842* (2013.01); *G09G 2320/0242* (2013.01); *G09G 2320/043* (2013.01); *G09G 2330/021* (2013.01); *H01L 27/124* (2013.01); *H10K 59/353* (2023.02)

(58) Field of Classification Search
CPC ..... H01L 25/167; H10K 59/1213; G09G 3/32
USPC ........................................... 345/440; 257/40
See application file for complete search history.

(56) References Cited

U.S. PATENT DOCUMENTS

| | | | | |
|---|---|---|---|---|
| 2020/0227488 | A1* | 7/2020 | Xin | H10K 59/65 |
| 2021/0313415 | A1* | 10/2021 | Ma | H10K 59/1315 |
| 2022/0157917 | A1* | 5/2022 | Park | H10K 59/1213 |
| 2022/0199734 | A1* | 6/2022 | Ko | H10K 59/131 |
| 2022/0229501 | A1* | 7/2022 | Suo | G06F 3/04166 |
| 2022/0320226 | A1* | 10/2022 | Yang | H10K 59/131 |
| 2022/0328597 | A1* | 10/2022 | Huang | H10K 50/813 |
| 2023/0088068 | A1* | 3/2023 | Han | H10K 50/84 257/40 |

* cited by examiner

*Primary Examiner* — Prabodh M Dharia
(74) *Attorney, Agent, or Firm* — ANOVA LAW GROUP PLLC

(57) ABSTRACT

A display panel and a display device are provided. The display panel includes a plurality of pixels. A pixel of the plurality of pixels includes a light-emitting layer, and the plurality of pixels include at least one first pixel and at least one second pixel. A first pixel is electrically connected to a first pixel circuit, and a second pixel is electrically connected to a second pixel circuit. An orthographic projection of the first pixel circuit on a plane of the display panel has an area smaller than an orthographic projection of the second pixel circuit on the plane of the display panel. In a direction perpendicular to the plane of the display panel, a light-emitting layer of the first pixel at least partially overlaps the second pixel circuit, and a light-emitting layer of the second pixel at least partially overlaps the second pixel circuit.

20 Claims, 10 Drawing Sheets

DISPLAY PANEL AND DISPLAY DEVICE

CROSS-REFERENCE TO RELATED APPLICATION

This application claims the priority of Chinese patent application No. 202210330447.X, filed on Mar. 31, 2022, the entirety of which is incorporated herein by reference.

FIELD

The present disclosure generally relates to the field of display technology and, more particularly, relates to a display panel and a display device.

BACKGROUND

With the continuous development of science and technology, modern society has entered the age of information technology and is developing towards intelligence. Display is a key link to realize information exchange and intelligence. Among the current display technologies, micro-LED display technology is considered as a disruptive next-generation display technology. The micro-LED display technology is a self-luminous display technology that integrates arrayed micron-scale LED light-emitting devices on an active driving substrate to achieve individual control and lighting, thereby outputting a display image. The micro-LED is featured with advantages such as low power consumption, high brightness, high color saturation, high response speed, long service life, high efficiency, small size and highly flexible, and is capable of being applied to any existing display applications from small size to large size.

To make the light-emitting efficiency and color cast performance of the micro-LED light-emitting device reach a best state, a pixel circuit with a substantially complex circuit structure is required to drive the micro-LED light-emitting device. The pixel circuit with a substantially complex circuit structure needs to occupy a substantially large area in the pixel unit, which makes the PPI (pixels per inch) of the display panel substantially low.

SUMMARY

One aspect of the present disclosure provides a display panel. The display panel includes a plurality of pixels. A pixel of the plurality of pixels includes a light-emitting layer, and the plurality of pixels include at least one first pixel and at least one second pixel. A first pixel of the at least one first pixel is electrically connected to a first pixel circuit, and a second pixel of the at least one second pixel is electrically connected to a second pixel circuit. An orthographic projection of the first pixel circuit on a plane of the display panel has an area smaller than an orthographic projection of the second pixel circuit on the plane of the display panel. In a direction perpendicular to the plane of the display panel, a light-emitting layer of the first pixel at least partially overlaps the second pixel circuit, and a light-emitting layer of the second pixel at least partially overlaps the second pixel circuit.

Another aspect of the present disclosure provides a display device. The display device includes a display panel. The display panel includes a plurality of pixels. A pixel of the plurality of pixels includes a light-emitting layer, and the plurality of pixels include at least one first pixel and at least one second pixel. A first pixel of the at least one first pixel is electrically connected to a first pixel circuit, and a second pixel of the at least one second pixel is electrically connected to a second pixel circuit. An orthographic projection of the first pixel circuit on a plane of the display panel has an area smaller than an orthographic projection of the second pixel circuit on the plane of the display panel. In a direction perpendicular to the plane of the display panel, a light-emitting layer of the first pixel at least partially overlaps the second pixel circuit, and a light-emitting layer of the second pixel at least partially overlaps the second pixel circuit.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
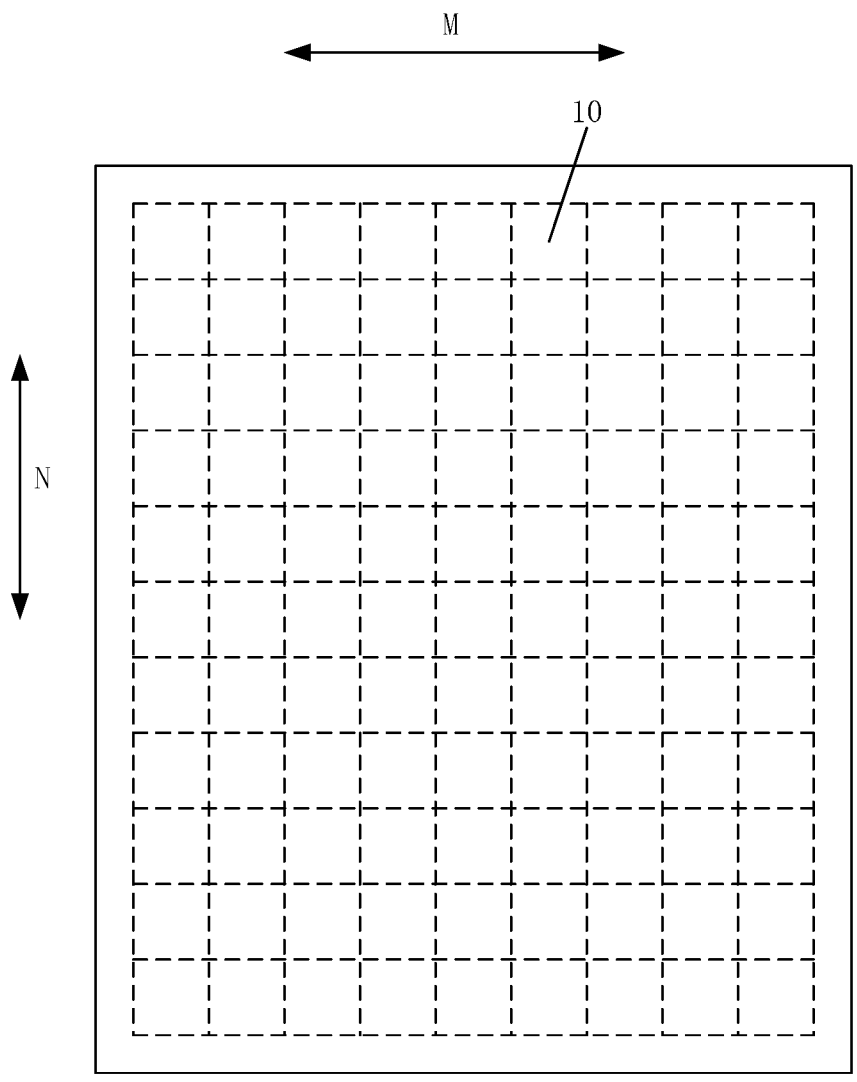
FIG. 1 illustrates a schematic top view of an exemplary display panel consistent with disclosed embodiments of the present disclosure.

FIG. 1 illustrates a schematic top view of a display panel consistent with disclosed embodiments of the present disclosure. Referring to FIG. 1, the display panel may include a plurality of pixel units 10 arranged in an array, where M may represent a row direction of the array, and N may represent a column direction of the array. Each pixel unit 10 may include at least two pixels.

Figure 2:
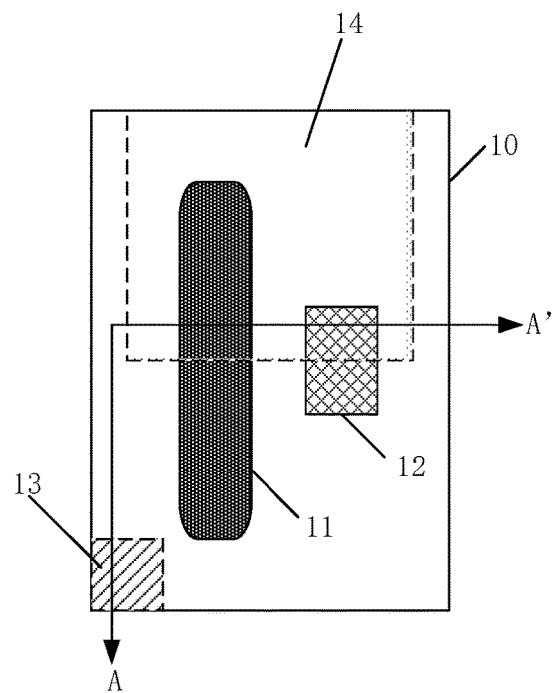
FIG. 2 illustrates a schematic diagram of a pixel unit in the display panel in FIG. 1 consistent with disclosed embodiments of the present disclosure.

FIG. 2 illustrates a schematic diagram of a pixel unit in the display panel in FIG. 1. Referring to FIG. 2, the display panel may include a plurality of pixels, and each pixel may include a light-emitting layer. The pixel may include a first pixel 11 and a second pixel 12. The first pixel 11 may be electrically connected to a first pixel circuit 13, and the second pixel 12 may be electrically connected to a second pixel circuit 14. An orthographic projection of the first pixel circuit 13 on the plane of the display panel may have an area smaller than an orthographic projection of the second pixel circuit 14 on the plane of the display panel.

In a direction perpendicular to the plane of the display panel, the light-emitting layer of the first pixel 11 may at least partially overlap the second pixel circuit 14, and the light-emitting layer of the second pixel 12 may at least partially overlap the second pixel circuit 14.

Referring to FIG. 2, the pixel unit 10 in the display panel may include the first pixel circuit 13 and the second pixel circuit 14. The orthographic projection of the first pixel circuit 13 on the plane of the display panel may have an area smaller than the orthographic projection of the second pixel circuit 14 on the plane of the display panel. In other words, the second pixel circuit 14 may occupy a larger area in the pixel unit 10, and the first pixel circuit 13 may occupy a smaller area in the pixel unit 10. Therefore, in the disclosed embodiments, two kinds of pixel circuits (e.g., the first pixel circuit 13 and the second pixel circuit 14) that occupy different areas in the pixel unit 10 may be used to drive different pixels. Compared with the method of driving all pixels by the second pixel circuit 14, the size of each pixel unit 10 may be greatly reduced, thereby increasing the pixel arrangement density of the display panel.

In addition, in the direction perpendicular to the plane of the display panel, the light-emitting layer of the first pixel 11 may at least partially overlap the second pixel circuit 14, and the light-emitting layer of the second pixel 12 may at least partially overlap the second pixel circuit 14. In other words, in the direction perpendicular to the plane of the display panel, the second pixel circuit 14 and the first pixel 11 may share a partial region of the pixel unit 10, and the second pixel circuit 14 and the second pixel 12 may share another partial region of the pixel unit 10, thereby further reducing the size of each pixel unit 10 and further improving the pixel arrangement density of the display panel.

In another embodiment, the first pixel 11 may include a quantum dot light-emitting unit, and the second pixel 12 may include a light-emitting diode (LED) light-emitting unit. Optionally, the second pixel 12 may include a micro-LED light-emitting unit.

The first pixel 11 may include a first light-emitting layer for emitting red light or green light. The second pixel 12 may include a second light-emitting layer for emitting blue light.

Figure 3:
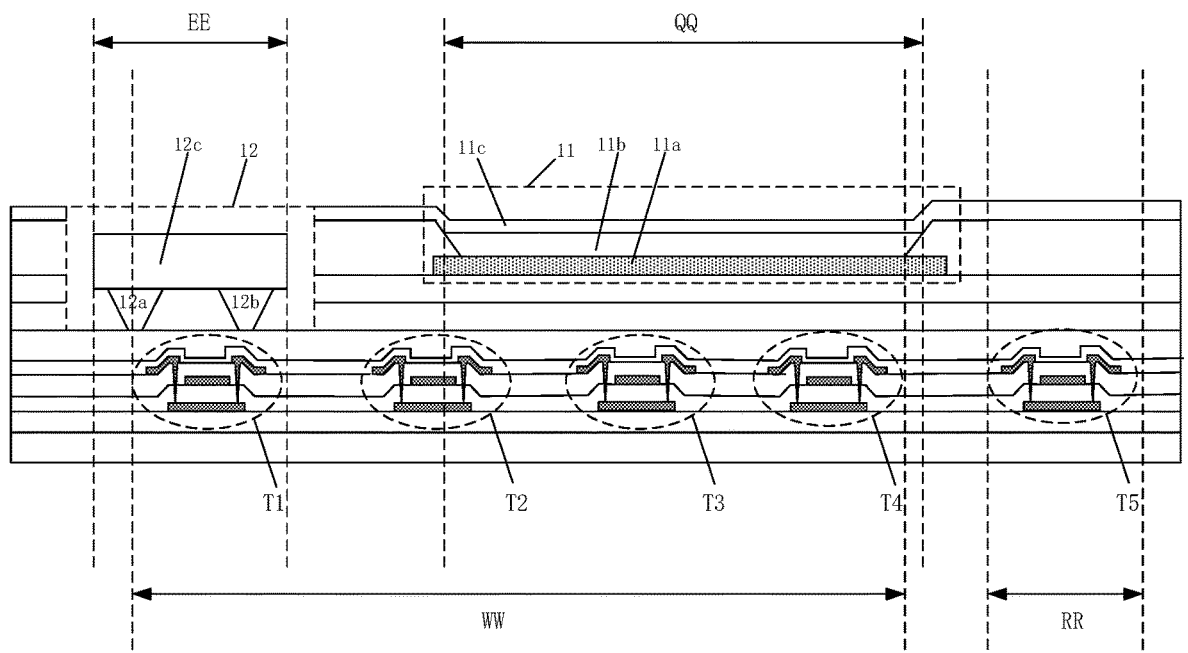
FIG. 3 illustrates an AA'-sectional view of the pixel unit in FIG. 2 consistent with disclosed embodiments of the present disclosure.

FIG. 3 illustrates an AA'-sectional view of the pixel unit in FIG. 2. Referring to FIG. 3, the first pixel 11 (the quantum dot light-emitting unit) may at least include an anode 11a, a light-emitting layer 11b and a cathode 11c that are stacked. The first pixel 11 may be located in a pixel opening. In the direction perpendicular to the plane of the display panel, an orthographic projection of the light-emitting layer 11b may fully cover an orthographic projection of the anode 11a exposed by the pixel opening. The anode 11a may be coupled to an electrode terminal of a corresponding thin film transistor T in the pixel circuit. The cathode 11c may be connected to any other voltage terminal. Under the action of the electric field, in the quantum dot light-emitting unit, the holes generated by the anode 11a and the electrons generated by the cathode 11c may move to the light-emitting layer 11b. When holes and electrons meet in the light-emitting layer 11b, energy excitons may be generated, and the energy excitons may emit light through radiative transitions.

The second pixel 12 (LED light-emitting unit or micro-LED light-emitting unit) may at least include an N electrode 12a, a P electrode 12b and an epitaxial layer 12c. The N electrode 12a or the P electrode 12b may be coupled to an electrode terminal of a corresponding thin film transistor T in the pixel circuit. The epitaxial layer 12c may at least include an N-type semiconductor layer, an active layer, and a P-type semiconductor layer that are stacked. The second light-emitting layer of the second pixel 12 may refer to the active layer.

Figure 5:
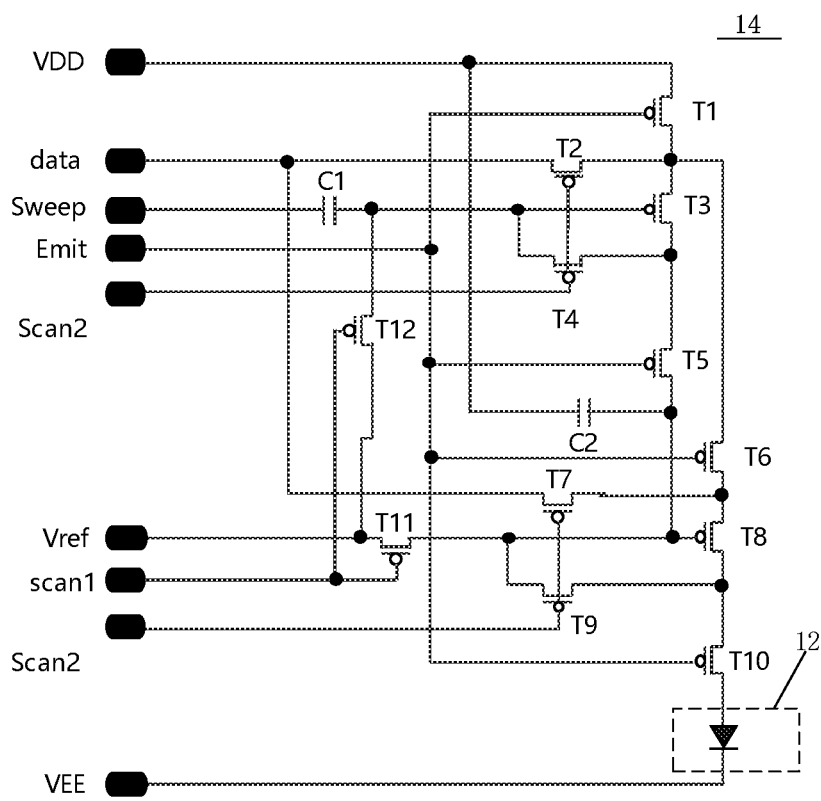
FIG. 5 illustrates a circuit structure of a second pixel circuit of an exemplary display panel consistent with disclosed embodiments of the present disclosure.

It should be noted that FIG. 5 may use five thin film transistors T1-T5 as an example for illustration. Among the five thin film transistors T1-T5 shown in FIG. 3, the thin film transistors T1-T4 may be configured to form part of the circuit structure of the second pixel circuit 14 that controls the second pixel 12 to operate, and the thin film transistor T5 may be configured to form part of the circuit structure of the first pixel circuit 13 that controls the first pixel 11 to operate. Referring to FIG. 3, in the direction perpendicular to the plane of the display panel, the light-emitting layer of the first pixel 11 may at least partially overlap the second pixel circuit 14, and the light-emitting layer of the second pixel 12 may at least partially overlap the second pixel circuit 14. The orthographic projection of the first light-emitting layer of the first pixel 11 on the display panel may be a region QQ, the orthographic projection of the second light-emitting layer of the second pixel 12 on the display panel may be a region EE, and the orthographic projection of the second pixel circuit 14 on the display panel may be a region WW, and the orthographic projection of the first pixel circuit 13 on the display panel may be a region RR.

The existing LED display device and the micro-LED display device have display problems with red light and green light. The light-emitting efficiency of the red light light-emitting unit is substantially low, and the light-emitting efficiency sharply decreases with the increase of temperature during the operating process, and the power consumption is the highest. The light-emitting peak position of the green light light-emitting unit shifts at low brightness. The display power consumption of both the LED light-emitting unit and the micro-LED light-emitting unit are higher than the display power consumption of the quantum dot light-emitting unit.

The existing display device with the quantum dot light-emitting unit has solved the technical problems of the display problem of red light and green light in the existing LED display device and micro-LED display device, where the light-emitting efficiency of red light LED is low and significantly decreases as the temperature increases, and the light-emitting peak position of the green light LED shifts at low brightness. Due to the characteristics of the inorganic light-emitting layer of the quantum dot light-emitting unit, the operating lifetime of the quantum dot light-emitting unit is even longer than the operating lifetime of the organic light-emitting diode (OLED) light-emitting unit, while the operating lifetime of the quantum dot light-emitting unit for emitting blue light may be substantially short.

Therefore, in the disclosed embodiments, the quantum dot light-emitting unit may be configured as the first pixel 11 for emitting red light or green light, and the LED light-emitting unit or the micro-LED light-emitting unit may be configured as the second pixel 12 for emitting blue light. In other words, the quantum dot light-emitting unit and the LED light-emitting unit or the micro-LED light-emitting unit may be combined for display.

The color cast problem caused by the deviation of the forward voltage or the deviation of the driving current between inorganic light emitting diodes (LEDs) may be substantially serious. To make the performance of the light-emitting efficiency and the visual color cast of the LED light-emitting unit or the micro-LED light-emitting unit that emits blue light reach the best state, the second pixel circuit 14 integrated with control functions such as pulse width modulation (PWM) control and pulse amplitude modulation (PAM) control may be used to drive the second pixel 12. The quantum dot light-emitting unit that emits red light or green light may merely need to use the first pixel circuit 13 integrated with the PWM control or the PAM control to drive the first pixel 11.

In one embodiment, the first pixel circuit 13 may include a 7T1C pixel circuit integrated with the PWM control or the PAM control, and the second pixel circuit 14 may include a combination of a 7T1C pixel circuit integrated with the PWM control and a 7T1C pixel circuit integrated with the PAM control. The first pixel circuit 13 may include seven thin film transistors in conjunction with other devices, and the second pixel circuit 14 may include seven or even more thin film transistors in conjunction with other devices.

Figure 4:
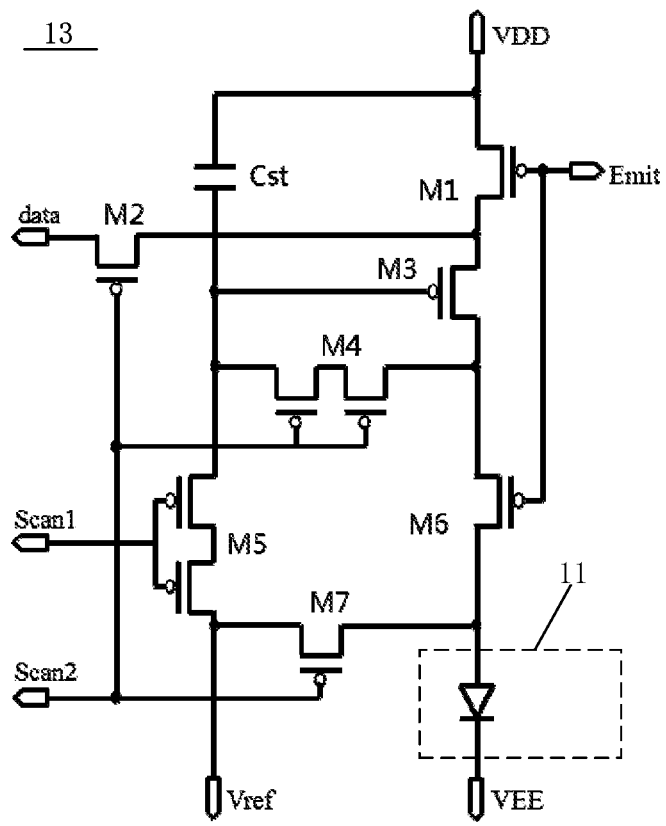
FIG. 4 illustrates a circuit structure of a first pixel circuit of an exemplary display panel consistent with disclosed embodiments of the present disclosure.

FIG. 4 illustrates a circuit structure of a first pixel circuit of a display panel consistent with various disclosed embodiments of the present disclosure. Referring to FIG. 4, the first pixel circuit 13 may include seven thin film transistors (M1-M7) and one capacitor (Cst). FIG. 5 illustrates a circuit structure of a second pixel circuit of a display panel consistent with various disclosed embodiments of the present disclosure. Referring to FIG. 5, the second pixel circuit 14 may include twelve thin film transistors (T1-T12) and two capacitors (C1 and C2).

It should be noted that the first pixel circuit 13 shown in FIG. 4 may merely be used as an example for illustration, and the first pixel circuit may include any other circuit structure. Similarly, the second pixel circuit 14 shown in FIG. 5 may merely be used as an example for illustration, and the second pixel circuit may include any other circuit structure. Compared with FIG. 4 and FIG. 5, the second pixel circuit 14 may at least include more thin film transistors than the first pixel circuit 13, such that the orthographic projection of the second pixel circuit 14 on the plane of the display panel may have an area greater than the orthographic projection of the first pixel circuit 13 on the plane of the display panel.

It should be noted that in the disclosed embodiments, not all the pixels in the pixel unit 10 use the second pixel circuit 14 that occupies a substantially large area to drive display. Two kinds of pixel circuits (e.g., the first pixel circuit 13 and the second pixel circuit 14) that occupy different areas in the pixel unit 10 may be used to drive corresponding pixels. Compared with the method of driving all pixels by the second pixel circuit 14, the size of each pixel unit 10 may be greatly reduced, thereby increasing the pixel arrangement density of the display panel.

In addition, different pixel circuits may be used to drive display of different types of pixels, such that different types of pixels may be driven for display by the corresponding most suitable driving methods, which may ensure that the light-emitting efficiency and visual color cast of each pixel may reach the best state, to maximize the display effect of the display panel. In the disclosed embodiments, the micro-LED light-emitting unit and the quantum dot light-emitting unit may be combined in a same panel for display. Compared with the display with merely micro-LED light-emitting units, the light color and efficiency performance of red light and green light may be improved, and the power consumption may be reduced to ⅒ of the display with merely micro-LED light-emitting units. Compared with the display with merely the quantum dot light-emitting units, the service lifetime of the blue light may be greatly improved.

Figure 6:
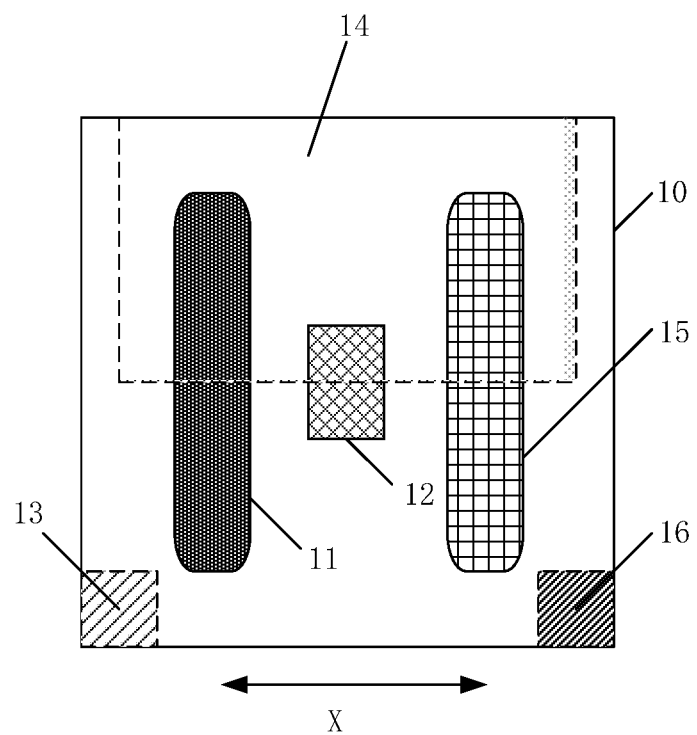
FIG. 6 illustrates a schematic diagram of a pixel unit of another exemplary display panel consistent with disclosed embodiments of the present disclosure.

FIG. 6 illustrates a schematic diagram of a pixel unit of another display panel consistent with disclosed embodiments of the present disclosure. In another embodiment, referring to FIG. 6, the display panel may further include a third pixel 15. The first pixel 11 and the third pixel 15 may emit light with different colors.

The third pixel 15 may be electrically connected to a third pixel circuit 16. An orthographic projection of the third pixel circuit 16 on the plane of the display panel may have an area smaller than the orthographic projection of the second pixel circuit 14 on the plane of the display panel.

In one embodiment, the first pixel 11 may include a quantum dot light-emitting unit, the second pixel 12 may include a LED light-emitting unit, and the third pixel 15 may include a quantum dot light-emitting unit. In one embodiment, the second pixel 12 may include a micro-LED light-emitting unit.

The third pixel 15 may include a third light-emitting layer, and the first light-emitting layer and the third light-emitting layer may emit light with different colors. When the first pixel 11 is used to emit red light, and the third pixel 15 is used to emit green light, the first light-emitting layer may be configured to emit red light, the third light-emitting layer may be configured to emit green light, and the second light-emitting layer may be configured to emit blue light, such that the display panel may achieve full-color display based on three primary colors.

The existing display device with the quantum dot light-emitting unit has solved the technical problems of the display problem of red light and green light in the existing LED display device and micro-LED display device, where the light-emitting efficiency of red light LED is low and significantly decreases as the temperature increases, and the light-emitting peak position of the green light LED shifts at low brightness. Due to the characteristics of the inorganic light-emitting layer of the quantum dot light-emitting unit, the operating lifetime of the quantum dot light-emitting unit is even longer than the operating lifetime of the OLED light-emitting unit, while the operating lifetime of the quantum dot light-emitting unit for emitting blue light may be substantially short.

Therefore, in the disclosed embodiments, the quantum dot light-emitting unit may be configured as the first pixel 11 for emitting red light, the LED light-emitting unit or the micro-LED light-emitting unit may be configured as the second pixel 12 for emitting blue light, and the quantum dot light-emitting unit may be configured as the third pixel 15 for emitting green light. In other words, the quantum dot light-emitting unit and the LED light-emitting unit or the micro-LED light-emitting unit may be combined for display.

The quantum dot light-emitting unit that emits red light or green light may not have display problem, and may merely need to use the third pixel circuit 16 integrated with the PWM control or the PAM control to drive the third pixel 15.

In one embodiment, the third pixel circuit 16 may include a 7T1C pixel circuit integrated with the PWM control or the PAM control. In other words, the third pixel circuit 16 may include seven thin film transistors in conjunction with other devices.

In one embodiment, the first pixel circuit 13 may be the same as the third pixel circuit 16. In another embodiment, the first pixel circuit 13 and the third pixel circuit 16 may include 7T1C pixel circuits with different circuit structures. In the case where the first pixel circuit 13 is the same as the third pixel circuit 16, the manufacturing process of the pixel circuit in the display panel may be simplified.

It should be noted that in the disclosed embodiments, not all the pixels in the pixel unit 10 use the second pixel circuit 14 that occupies a substantially large area to drive display. Three kinds of pixel circuits (e.g., the first pixel circuit 13, the second pixel circuit 14, and the third pixel circuit 16) that occupy different areas in the pixel unit 10 may be used to drive corresponding pixels. Compared with the method of driving all pixels by the second pixel circuit 14, the size of each pixel unit may be greatly reduced, thereby increasing the pixel arrangement density of the display panel.

In addition, different pixel circuits may be used to drive display of different types of pixels, such that different types of pixels may be driven for display by the corresponding most suitable driving methods, which may ensure that the light-emitting efficiency and visual color cast of each pixel may reach the best state, to maximize the display effect of the display panel.

In one embodiment, referring to FIG. 6, in the direction perpendicular to the plane of the display panel, the third light-emitting layer of the third pixel 15 may at least partially overlap the second pixel circuit 14. Specifically, in the direction perpendicular to the plane of the display panel, the first light-emitting layer of the first pixel 11 may at least partially overlap the second pixel circuit 14, the second light-emitting layer of the second pixel 12 may at least partially overlap the second pixel circuit 14, and the third light-emitting layer of the third pixel 15 may at least partially overlap the second pixel circuit 14.

In other words, in the direction perpendicular to the plane of the display panel, the second pixel circuit 14 and the first pixel 11 may share a partial region of the pixel unit 10, the second pixel circuit 14 and the second pixel 12 may share another partial region of the pixel unit 10, and the second pixel circuit 14 and the third pixel 15 may share another partial region of the pixel unit 10, thereby further reducing the size of each pixel unit 10 and further improving the pixel arrangement density of the display panel.

In another embodiment, referring to FIG. 1, the display panel may include a plurality of pixel units 10. The plurality of pixel units 10 may be arranged in an array with 11 rows and 9 columns as an example.

Referring to FIG. 6, one pixel unit 10 may include one first pixel 11, one second pixel 12 and one third pixel 15. Along a first direction X, the first pixel 11 and the third pixel 15 may be disposed opposite to each other, and the second pixel 12 may be disposed between the first pixel 11 and the third pixel 15. The first direction X may be parallel to the plane of the display panel.

In the direction perpendicular to the plane of the display panel, the area of the orthographic projection of the first pixel 11 on the plane of the display panel and the area of the orthographic projection of the third pixel 15 on the plane of the display panel may be larger than the area of the orthographic projection of the second pixel 12 on the plane of the display panel.

In one embodiment, the first pixel 11 may include a quantum dot light-emitting unit, the second pixel 12 may include a LED light-emitting unit, and the third pixel 15 may include a quantum dot light-emitting unit. In one embodiment, the second pixel 12 may include a micro-LED light-emitting unit. When the second pixel 12 includes a micro-LED light-emitting unit, because the light-emitting efficiency of the micro-LED light-emitting unit is substantially high, the micro-LED light-emitting unit may achieve the required luminous brightness without the need for a large size. The size of the current micro-LED light-emitting unit may often be less than 50 µm. When the size of the micro-LED light-emitting unit is substantially small, the light-emitting area of the second pixel 12 may be substantially small. In other words, the second pixel 12 may occupy a substantially small area in the pixel unit 10. Therefore, the light-emitting area of the first pixel 11 and the light-emitting area of the third pixel 15 may appropriately increase based on the size of the pixel unit 10, to improve the light-emitting efficiency of the first pixel 11 and the light-emitting efficiency of the third pixel 15. Further, the driving current applied to the first pixel 11 and the third pixel 15 under the same luminous brightness may be reduced, thereby increasing the display lifetime of the first pixel 11 and the third pixel 15. In addition, because the area of the blue LED is small, a variety of pixel arrangements may be implemented in one pixel unit, thereby improving the display resolution.

Figure 7:
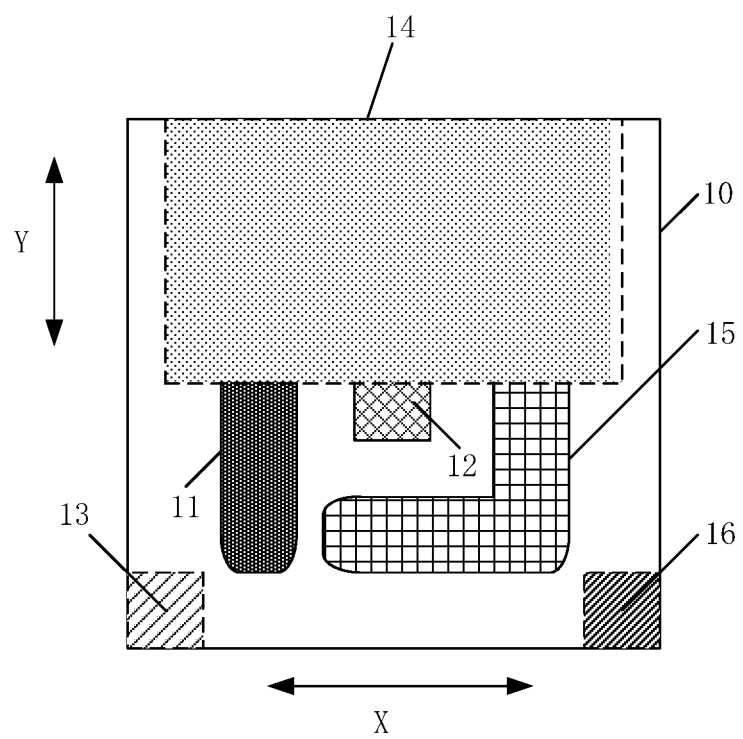
FIG. 7 illustrates a schematic diagram of a pixel unit of another exemplary display panel consistent with disclosed embodiments of the present disclosure.

FIG. 7 illustrates a schematic diagram of a pixel unit of another display panel consistent with disclosed embodiments of the present disclosure. In one embodiment, referring to FIG. 7, in the first direction X, the second pixel 12 may at least partially overlap the first pixel 11, and the second pixel 12 may at least partially overlap the third pixel 15. In the second direction Y, the second pixel 12 may at least partially overlap the first pixel 11, and the second pixel 12 may at least partially overlap the third pixel 15.

The first direction X may intersect with the second direction Y, and the second direction Y may be parallel to the plane of the display panel.

In one embodiment, referring to FIG. 7, the first direction X and the second direction Y may be perpendicular to each other for illustration. Based on the structures of the first pixel 11 and the third pixel 15 shown in FIG. 6, the structures of the first pixel 11 and the third pixel 15 may be improved, to further increase the light-emitting areas of the first pixel 11 and the third pixel 15, to maximize the light-emitting efficiency of the first pixel 11 and the third pixel 15. Further, the driving current applied to the first pixel 11 and the third pixel 15 under the same luminous brightness may be reduced, thereby increasing the display lifetime of the first pixel 11 and the third pixel 15, and improving the display effect of the display panel.

Figure 8:
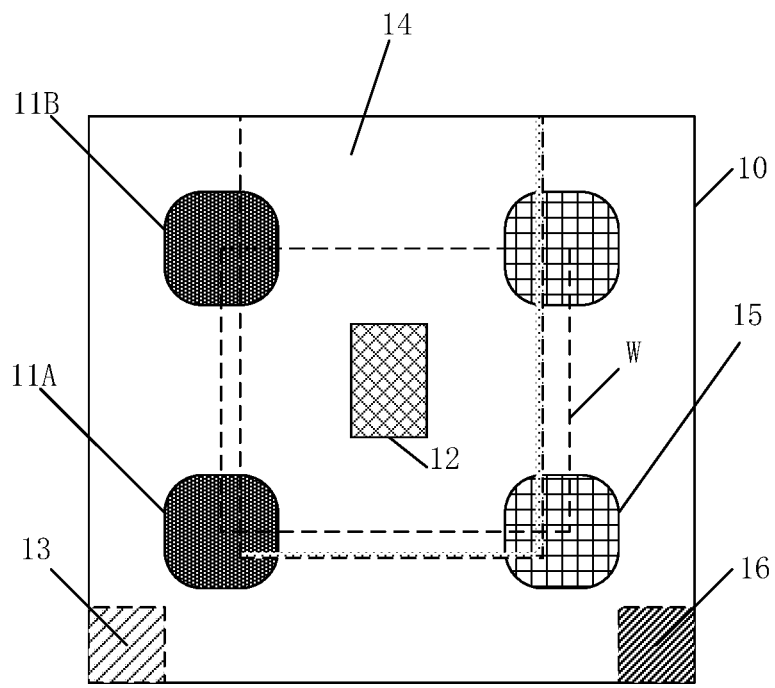
FIG. 8 illustrates a schematic diagram of a pixel unit of another exemplary display panel consistent with disclosed embodiments of the present disclosure.

FIG. 8 illustrates a schematic diagram of a pixel unit of another display panel consistent with disclosed embodiments of the present disclosure. In one embodiment, referring to FIG. 1, the display panel may include a plurality of pixel units 10. The plurality of pixel units 10 may be arranged in an array.

Referring to FIG. 8, one pixel unit 10 may include two first pixels 11, one second pixel 12 and two third pixels 15. Centers of the two first pixels 11 and centers of the two third pixels 25 may form a virtual quadrilateral W. The second pixel 12 may be located within the virtual quadrilateral W, and the second pixel 12 may cover a geometric center of the virtual quadrilateral W.

In one embodiment, the center of the first pixel 11 may be the geometric center of the first pixel 11. For the first pixel 11 whose shape is a rectangle, the center of the first pixel 11 may be the intersection of the diagonal lines of the rectangle. Similarly, the centers of the second pixel 12 and the third pixel 15 may be the geometric centers of the second pixel 12 and the third pixel 15, respectively.

In one embodiment, the first pixel 11 may include a quantum dot light-emitting unit, the second pixel 12 may include a LED light-emitting unit, and the third pixel 15 may include a quantum dot light-emitting unit. In one embodiment, the second pixel 12 may include a micro-LED light-emitting unit. When the second pixel 12 includes a micro-LED light-emitting unit, the size of the micro-LED light-emitting unit may often be less than 50 µm, and the light-emitting area of the second pixel 12 may be substantially small. In other words, the second pixel 12 may occupy a substantially small area in the pixel unit 10. Therefore, various other pixel arrangements may be achieved in the area of the pixel unit 10 except for the second pixel 12, thereby improving the display resolution and display effect of the display panel.

The second pixel 12 may be disposed within the virtual quadrilateral W and may cover the geometric center of the virtual quadrilateral W. The center of the second pixel 12 may coincide with the geometric center of the virtual quadrilateral W. When one second pixel 12, any one of the first pixels 11 and any one of the third pixels 15 form a full-color display unit, the problem of weak blue light may not occur, which may improve the display effect of the display panel. In one embodiment, referring to FIG. 8, a line connecting the centers of the two first pixels 11 may form one side of the virtual quadrilateral W.

Figure 9:
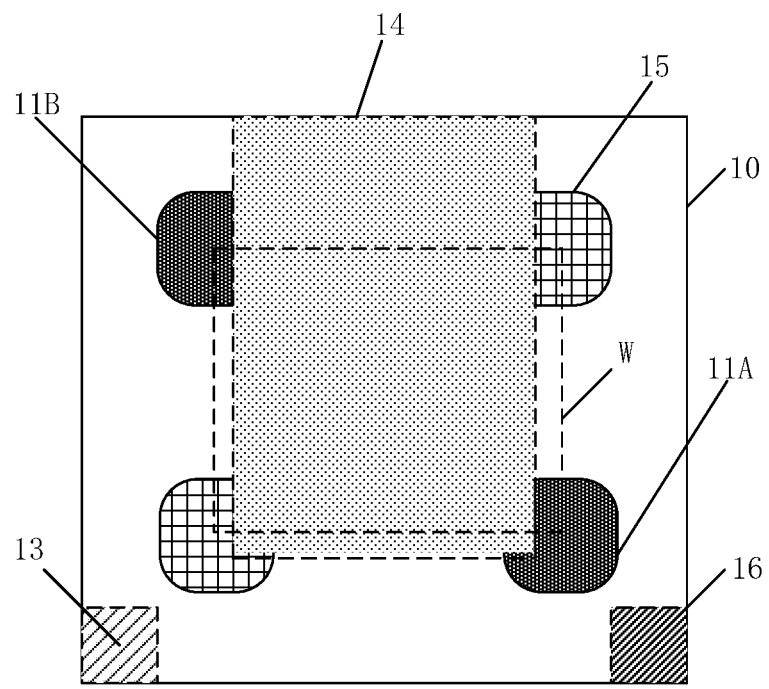
FIG. 9 illustrates a schematic diagram of a pixel unit of another exemplary display panel consistent with disclosed embodiments of the present disclosure.

FIG. 9 illustrates a schematic diagram of a pixel unit of another display panel consistent with disclosed embodiments of the present disclosure. In another embodiment, referring to FIG. 9, the line connecting the centers of the two first pixels 11 may form a diagonal of the virtual quadrilateral W.

Figure 10:
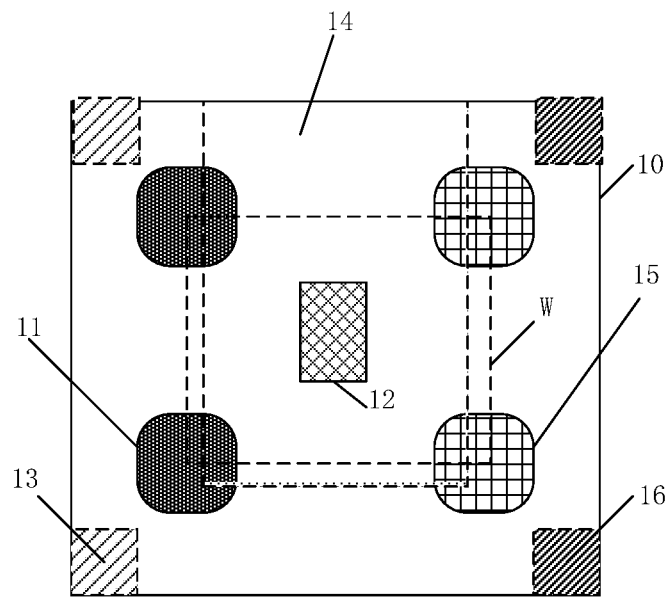
FIG. 10 illustrates a schematic diagram of a pixel unit of another exemplary display panel consistent with disclosed embodiments of the present disclosure.

FIG. 10 illustrates a schematic diagram of a pixel unit of another display panel consistent with disclosed embodiments of the present disclosure. In another embodiment, referring to FIG. 10, when one pixel unit 10 includes two first pixels 11 and two third pixels 15, each first pixel 11 may be provided with one first pixel circuit 13, and each third pixel 15 may be provided with one third pixel circuit 16, to ensure the operating performance of each first pixel 11 and third pixel 15.

Figure 11:
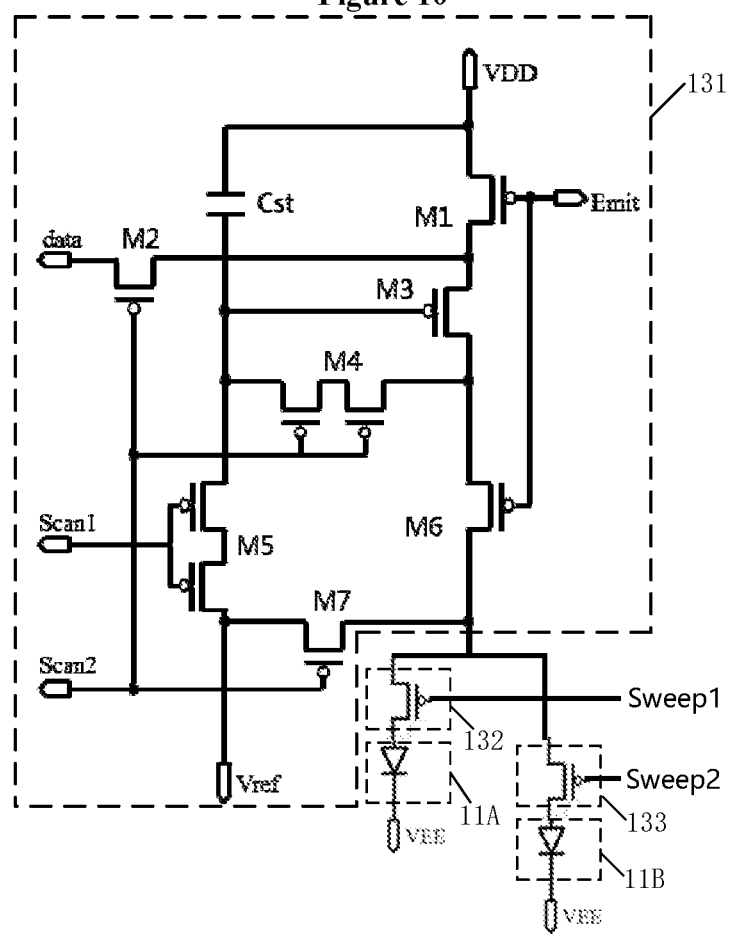
FIG. 11 illustrates a circuit structure of a first pixel circuit of another exemplary display panel consistent with disclosed embodiments of the present disclosure.

FIG. 11 illustrates a circuit structure of a first pixel circuit of another display panel consistent with disclosed embodiments of the present disclosure. In another embodiment, referring to FIG. 11, the first pixel circuit 13 may include a driving module 131, and the driving module 131 may be configured to provide a driving current for the first pixel 11.

The first pixel circuit 13 may further include a first switch module 132 and a second switch module 133. A first terminal of the first switch module 132 may be electrically connected to an output terminal of the driving module 131, and a first terminal of the second switch module 133 may be electrically connected to the output terminal of the driving module 131. A second terminal of the first switch module 132 may be connected to a $1^{st}$ first pixel 11A, and a second terminal of the second switch module 133 may be connected to a $2^{nd}$ first pixel 11B.

The driving module 131 may provide a driving current for the first pixel 11, and the first pixel 11 may perform display in response to the driving current.

In another embodiment, the two first pixels 11 may share one driving module 131 of the first pixel circuit 13. In conjunction with the first switch module 132 and the second switch module 133, the driving current may be controlled to flow to the two first pixels 11, respectively.

For example, when the first switch module 132 is in a turned-on state and the second switch module 133 is in a turned-off state, the driving current generated by the driving module 131 may flow to the $1^{st}$ first pixel 11A and may not flow to the $2^{nd}$ first pixel 11B. In view of this, the first $1^{st}$ pixel 11A may perform display based on the driving current, and the $2^{nd}$ first pixel 11B may not perform display. When the first switch module 132 is in the turned-off state and the second switch module 133 is in the turned-on state, the driving current generated by the driving module 131 may flow to the $2^{nd}$ first pixel 11B, and may not flow to the $1^{st}$ first pixel 11A. In view of this, the $1^{st}$ first pixel 11A may not perform display, and the $2^{nd}$ first pixel 11B may perform display based on the driving current. When both the first switch module 132 and the second switch module 133 are in the turned-on state, the driving current generated by the driving module 131 may flow to the $1^{st}$ first pixel 11A and the $2^{nd}$ first pixel 11B. In view of this, the $1^{st}$ first pixel 11A and the $2^{nd}$ first pixel 11B may perform display respectively based on the driving current. When both the first switching module 132 and the second switching module 133 are in the turned-off state, the driving current generated by the driving module 131 may not flow to the $1^{st}$ first pixel 11A and the $2^{nd}$ first pixel 11B. In view of this, both the $1^{st}$ first pixel 11A and the $2^{nd}$ first pixel 11B may not perform display.

It should be noted that in the disclosed embodiments, the two first pixels 11 may share one driving module 131 of the first pixel circuit 13. In conjunction with the first switch module 132 and the second switch module 133, under the condition of controlling the two first pixels 11 to operate normally, the circuit structure for controlling the display of the two first pixels 11 may be significantly simplified, and the size of each pixel unit 10 may be greatly reduced, thereby improving the pixel arrangement density of the display panel.

It should be noted that when the quantity of the first pixels 11 needs to increase, for example, when the quantity of the first pixels 11 is three, additional one switch module may be added based on the actual circuit load to control the driving current to flow to a $3^{rd}$ first pixel.

It should be noted that the specific circuit form of the driving module shown in FIG. 11 may be used as an example for illustration. The driving module may also include any other circuit structure, as long as the driving module is capable of providing the driving current for the pixel to perform display.

It should be noted that the first switch module 132 may be a transistor. A first terminal of the transistor may be electrically connected to the output terminal of the driving module 131, and a second terminal of the transistor may be connected to the $1^{st}$ first pixel 11A. A control terminal of the transistor may receive a switch control signal Sweep1, and the switch control signal Sweep1 may be configured to control the transistor to be in the turned-on state or the turned-off state.

Similarly, the second switch module 133 may be a transistor. A first terminal of the transistor may be electrically connected to the output terminal of the driving module 131, and a second terminal of the transistor may be connected to the $2^{nd}$ first pixel 11B. A control terminal of the transistor may receive a switch control signal Sweep2, and the switch control signal Sweep2 may be configured to control the transistor to be in the turned-on state or the turned-off state.

When one pixel unit 10 includes two third pixels 15, the design of the third pixel circuit 16 may be the same as the design of the first pixel circuit 13 for driving two first pixels 11. In one embodiment, the third pixel circuit 16 may include a driving module. The driving module may be configured to provide a driving current for the third pixels 15. The two third pixels 15 may share one driving module of the third pixel circuit 16, and switch modules may be used to achieve the control of the two third pixels 15.

It should be noted that in the disclosed embodiments, the two third pixels 15 may share one driving module of the third pixel circuit 16. Under the condition of controlling the two third pixels 15 to operate normally in conjunction with the switch modules, the circuit structure for controlling the display of the two third pixels 15 may be significantly simplified, and the size of each pixel unit 10 may be greatly reduced, thereby improving the pixel arrangement density of the display panel.

It should be noted that when the quantity of the third pixels 15 needs to increase, for example, when the quantity of the third pixels 15 is three, additional one switch module may be added based on the actual circuit load to control the driving current to flow to the $3^{rd}$ third pixel.

Figure 12:
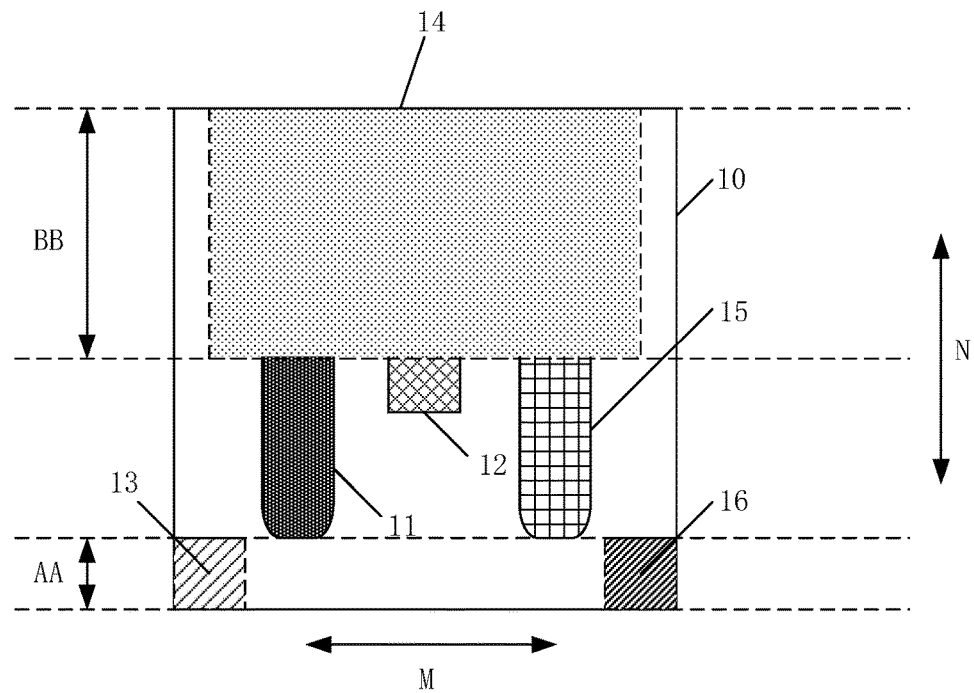
FIG. 12 illustrates a schematic arrangement structure of a pixel unit of another exemplary display panel consistent with disclosed embodiments of the present disclosure.

FIG. 12 illustrates a schematic arrangement structure of a pixel unit of another display panel consistent with disclosed embodiments of the present disclosure. Referring to FIG. 1, the plurality of pixel units 10 may be arranged in an array. In another embodiment, referring to FIG. 12, in the column direction N of the array, the pixel unit 10 may include a first region AA and a second region BB that are disposed opposite to each other, and the first region AA and the second region BB may be spaced apart by a gap.

The first pixel circuit 13 and the third pixel circuit 16 may be disposed in the first region AA, and the second pixel circuit 14 may be disposed in the second region BB.

In one embodiment, in the column direction N of the array, the second pixel circuit 14 may be disposed on one side of the pixel unit 10, and the first pixel circuit 13 and the third pixel circuit 16 may be disposed on corresponding the other side of the pixel unit 10. The second pixel circuit 14 may be wired on the side of the pixel unit 10 where the second pixel circuit 14 is located, and the first pixel circuit 13 and the third pixel circuit 16 may be wired on the other side of the pixel unit 10 where the first pixel circuit 13 and the third pixel circuit 16 are located.

In other words, based on the distribution of the first pixel circuit 13, the second pixel circuit 14 and the third pixel circuit 16 in the pixel unit 10, the first pixel circuit 13, the second pixel circuit 14 and the third pixel circuit 16 may be wired in different regions, which may greatly simplify the wiring difficulty.

In one embodiment, referring to FIG. 12, in a row direction M of the array, the first pixel circuit 13 and the third pixel circuit 16 may be disposed on both sides of the second pixel circuit 14. In other words, the first pixel circuit 13 and the third pixel circuit 16 may be disposed as far away from each other as possible. In the case of simplifying the wiring difficulty, the problem of crosstalk between the first pixel circuit 13 and the third pixel circuit 16 may be avoided, thereby improving the signal stability and improving the display effect of the display panel.

Figure 13:
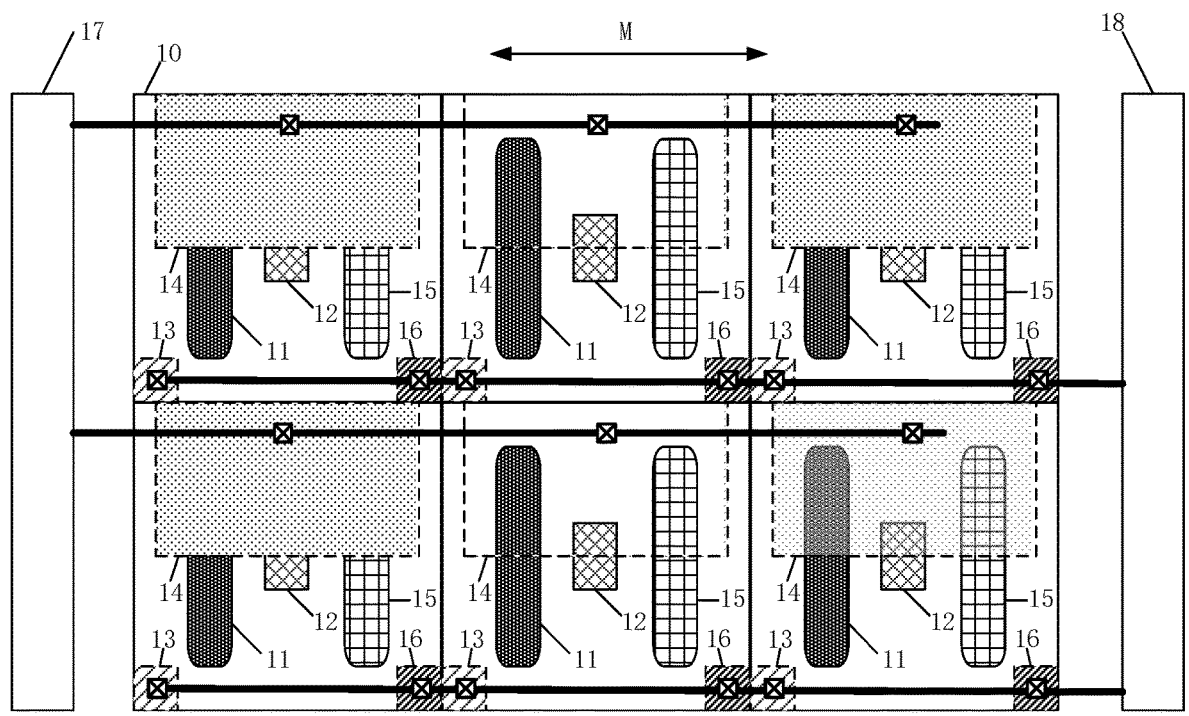
FIG. 13 illustrates a schematic diagram of another exemplary display panel consistent with disclosed embodiments of the present disclosure.

FIG. 13 illustrates a schematic diagram of another display panel consistent with disclosed embodiments of the present disclosure. Referring to FIG. 13, the display panel may further include a first gate driving circuit 17 and a second gate driving circuit 18.

In the row direction M of the array, the display panel may include a first side and a second side that are disposed opposite to each other. The first gate driving circuit 17 may be disposed on the first side and may be electrically connected to the second pixel circuit 14. The second gate driving circuit 18 may be disposed on the second side, and may be electrically connected to the first pixel circuit 13 and the third pixel circuit 16.

In one embodiment, based on the distribution of the first pixel circuit 13, the second pixel circuit 14 and the third pixel circuit 16 in the pixel unit 10, the first gate driving circuit 17 may perform wiring on the second pixel circuit 14 on the side of the pixel unit 10 where the second pixel circuit 14 is located to achieve electrical connection. The second gate driving circuit 18 may perform wiring on the first pixel circuit 13 and the third pixel circuit 16 on the other side of the pixel unit 10 where the first pixel circuit 13 and the third pixel circuit 16 are located to achieve electrical connection.

It should be noted that based on the distribution of the first pixel circuit 13, the second pixel circuit 14 and the third pixel circuit 16 in the pixel unit 10, the wiring difficulty of the first gate driving circuit 17 and the second gate driving circuit 18 may be greatly reduced.

Figure 14:
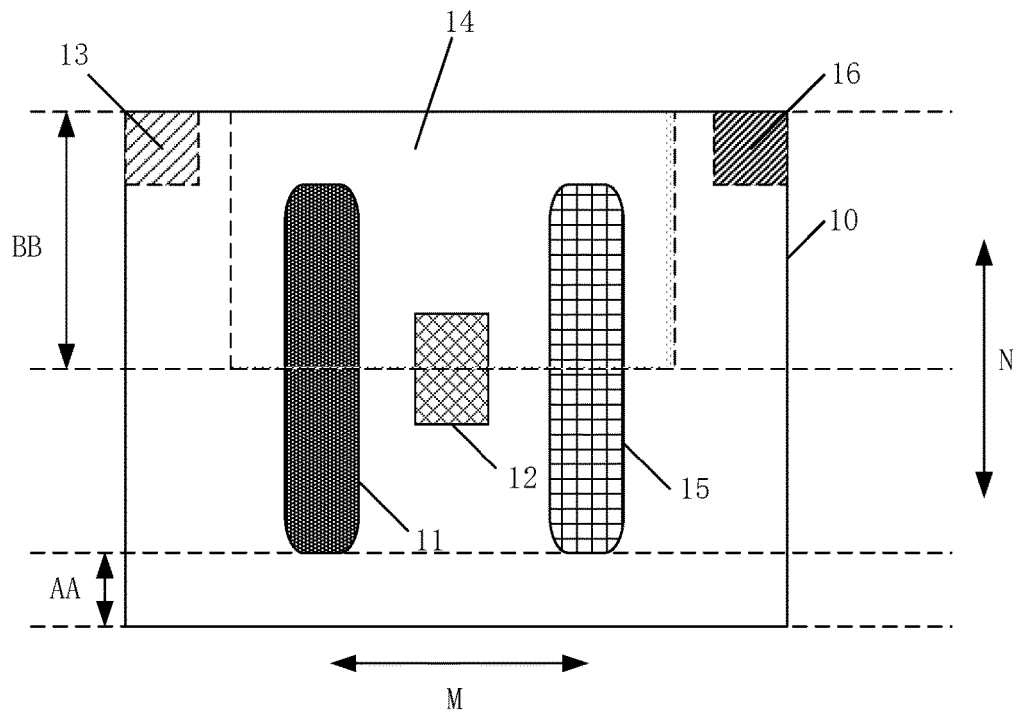
FIG. 14 illustrates a schematic arrangement structure of a pixel unit of another exemplary display panel consistent with disclosed embodiments of the present disclosure.

FIG. 14 illustrates a schematic arrangement structure of a pixel unit of another display panel consistent with disclosed embodiments of the present disclosure. In another embodiment, referring to FIG. 14, the first pixel circuit 13, the second pixel circuit 14 and the third pixel circuit 16 may be disposed in the second region BB. In the row direction M of the array, the first pixel circuit 13 and the third pixel circuit 16 may be located on both sides of the second pixel circuit 14.

It should be noted that in the actual design process of the display panel, the first pixel circuit 13, the second pixel circuit 14 and the third pixel circuit 16 may be reasonably arranged in the pixel unit 10 based on actual requirements, which may not be limited by the present disclosure.

Figure 15:
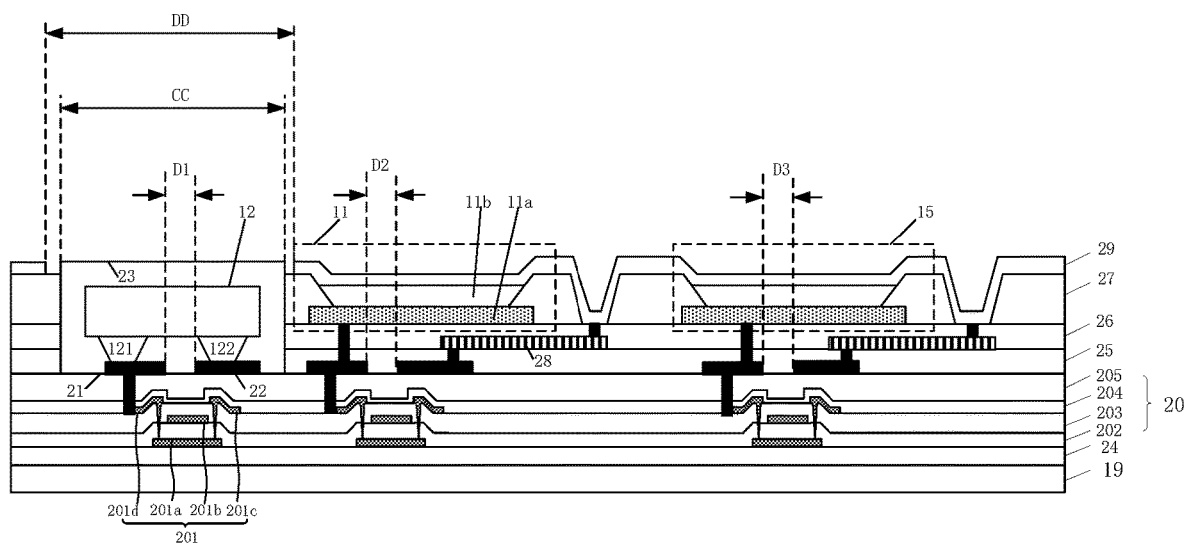
FIG. 15 illustrates a schematic cross-sectional view of an exemplary display panel consistent with disclosed embodiments of the present disclosure.

FIG. 15 illustrates a schematic cross-sectional view of another display panel consistent with disclosed embodiments of the present disclosure. In another embodiment, referring to FIG. 15, the display panel may include a substrate 19, and an array layer 20 disposed on a side of substrate 19. The display panel may also include the first pixel 11 and the second pixel 12 disposed on a side of the array layer 20 away from the substrate 19. Further, the display panel may include an encapsulation structure 23 disposed on the side of the array layer 20 away from the substrate 19. The encapsulation structure 23 may be configured to encapsulate the second pixel 12.

In one embodiment, referring to FIG. 15, the display panel may further include a third pixel 15 disposed on the side of the array layer 20 away from the substrate 19. The first pixel 11 may include a quantum dot light-emitting unit, the second pixel 12 may include a micro-LED light-emitting unit, and the third pixel 15 may include a quantum dot light-emitting unit. The first pixel 11 may emit red light, the second pixel 12 may emit blue light, and the third pixel 15 may emit green light as an example, such that the display panel may achieve full-color display based on three primary colors.

In one embodiment, the array layer 20 may be referred to a TFT (thin film transistor) layer, and may be configured to control the operating states of the first pixel 11, the second pixel 12 and the third pixel 15.

Referring to FIG. 15, the array layer 20 may include a plurality of thin film transistors 201. The thin film transistor 201 may include an active layer 201a, a gate electrode 201b, a source electrode 201c, and a drain electrode 201d. It should be noted that the source electrode 201c and the drain electrode 201d may be located in a same layer. The array layer 20 may further include a gate insulating layer 202 disposed between the active layer 201a and the gate electrode 201b, an interlayer insulating layer 203 disposed between the gate electrode 201b and each of the source electrode 201c and the drain electrode 201d, a passivation layer 204 disposed on a side of the source electrode 201c and the drain electrode 201d away from the interlayer insulating layer 203, and a planarization layer 205 on a side of the passivation layer 204 away from the interlayer insulating layer 203. A plurality of sets of the electrode pad group formed by a first electrode pad 21 and a second electrode pad 22 may be disposed on a side of the planarization layer 205 away from the substrate 19. The first electrode pad 21 and the second electrode pad 22 may be electrically connected to the corresponding electrode terminals of the thin film transistor 201, respectively.

It should be noted that in the disclosed embodiments, the thin film transistor 201 may be a P-type thin film transistor or an N-type thin film transistor. In one embodiment, the P-type thin film transistor may be used as an example for illustration.

Referring to FIG. 15, a through-hole may be formed by etching the planarization layer 205 and the passivation layer 204 to expose the corresponding electrode terminal of the thin film transistor 201. Therefore, the first electrode pad 21 and the second electrode pad 22 may be electrically connected to corresponding electrode terminals of the thin film transistor 201.

In one embodiment, referring to FIG. 15, the display panel may further include a base buffer layer 24 disposed between the substrate 19 and the array layer 20. The base buffer layer 24 may include but may not be limited to an inorganic material layer or an organic material layer. The material of the inorganic material layer may include but may not be limited to silicon oxide, silicon nitride, silicon oxynitride, aluminum oxide or aluminum nitride, etc. The material of the organic material layer may include but may not be limited to acrylic, or PI, etc.

Because the first pixel 11 is a quantum dot light-emitting unit, the second pixel 12 is a micro-LED light-emitting unit, and the third pixel 15 is a quantum dot light-emitting unit, to solve the limitation of the arrangement of the second pixels 12 on the array layer 20, a plurality of sets of electrode pad group formed by the first electrode pad 21 and the second electrode pad 22 may be disposed on the side of the array layer 20 facing away from the substrate 19. The second pixel 12 may include a first electrode 121 and a second electrode 122. The first electrode pad 21 may be electrically connected to the first electrode 121, and the second electrode pad 22 may be electrically connected to the second electrode 122. In other words, the array layer 20 may be the same as the array layer of the full micro-LED display panel.

It should be noted that a distance between the first electrode pad 21 and the second electrode pad 22 corresponding to the second pixel 12 may be D1, and a distance between the first electrode pad 21 and the second electrode pad 22 corresponding to the first pixel 11 may be D2, and a distance between the first electrode pad 21 and the second electrode pad 22 corresponding to the third pixel 15 may be D3, where D1=D2=D3.

Further, referring to FIG. 15, after the second pixel 12 is transferred to the array layer 20, the second pixel 12 may need to be encapsulated individually, to avoid damage to the second pixel 12 in the subsequent film layer fabrication process.

In one embodiment, a minimum size of the encapsulation structure 23 may need to exceed the maximum size of the second pixel 12 by more than 10 μm, to prevent the encapsulation structure 23 from causing damage to the second pixel 12.

Further, referring to FIG. 15, the display panel may further include a first buffer layer 25, a second buffer layer 26 and a pixel defining layer 27 disposed on the side of the planarization layer 205 away from the substrate 19 in sequence.

In one embodiment, after the second pixel 12 is encapsulated, the first buffer layer 25 may be first formed, and a photolithography process may be performed on the first buffer layer 25 to expose the first electrode pad 21 and the second electrode pad 22. A patterned auxiliary cathode 28 may be formed on the side of the first buffer layer 25 away from the substrate 19, and the patterned auxiliary cathode 28 may be connected to the second electrode pad 22 through a through-hole penetrating through the first buffer layer 25. Then, the second buffer layer 26 may be formed on the side of the first buffer layer 25 away from the substrate 19, and an anode layer of the first pixel 11 and the third pixel 15 may be formed on the side of the second buffer layer 26 away from the substrate 19. The anode layer may be connected to the first electrode pad 21 through a through-hole penetrating through the first buffer layer 25 and the second buffer layer 26. Ultimately, the pixel defining layer 27 may be formed. The pixel defining layer 27 may expose the encapsulation structure 23 that encapsulates the second pixel 12, and may include a plurality of openings for exposing the anode layer of the first pixel 11 and the third pixel 15.

It should be noted that in the direction perpendicular to the plane of the display panel, an orthographic projection of the opening on the plane of the display panel may partially overlap an orthographic projection of the auxiliary cathode 28 on the plane of the display panel.

Further, light-emitting layers corresponding to the first pixel 11 and the third pixel 15 may be formed in the opening. A cathode layer 29 may be formed on the side of the pixel defining layer 27 away from the substrate 19. The cathode layer 29 may be connected to the auxiliary cathode 28 through a through-hole penetrating through the pixel defining layer 27 and the second buffer layer 26, to achieve the connection between the cathode layer 29 and the second electrode pad 22, and to further achieve the connection between the cathode layer 29 and the thin film transistor 201.

Because the first pixel 11 and the third pixel 15 are quantum dot light-emitting units, to improve the light-emitting efficiency of the first pixel 11 and the third pixel 15, the coverage area of the corresponding light-emitting layers may be substantially large. In the direction perpendicular to the plane of the display panel, an orthographic projection of the corresponding light-emitting layer on the plane of the display panel may at least partially cover the orthographic projection of the first electrode pad 21 on the plane of the display panel and the orthographic projection of the second electrode pad 22 on the plane of the display panel. Referring to FIG. 15, the orthographic projection of the light-emitting layer on the plane of the display panel may fully cover the orthographic projection of the second electrode pad 22 on the plane of the display panel. Therefore, in the disclosed embodiments, to achieve the connection between the second electrode pad 22 and the cathode layer 29, the auxiliary cathode 28 may be provided. In the direction perpendicular to the plane of the display panel, the orthographic projection of the cathode layer 29 on the plane of the display panel may at least partially overlap the orthographic projection of the auxiliary cathode 28 on the plane of the display panel. In other words, the auxiliary cathode 28 may be extended beyond a region of the opening, to achieve the connection with the cathode layer 29.

It should be noted that referring to FIG. 15, in the direction perpendicular to the plane of the display panel, the orthographic projection of the second pixel 12 on the plane of the display panel may not overlap the orthographic projection of the cathode layer 29 on the plane of the display panel, to ensure the light-emitting efficiency of the second pixel 12 and to prevent the cathode layer 29 from blocking the light emitted from the second pixel 12. The orthographic projection of the second pixel 12 on the plane of the display panel may be a region CC, and a region of the display panel except for the orthographic projection of the cathode layer 29 on the plane of the display panel, in other words, the region not covered by the cathode layer 29, may be a region DD.

Figure 16:
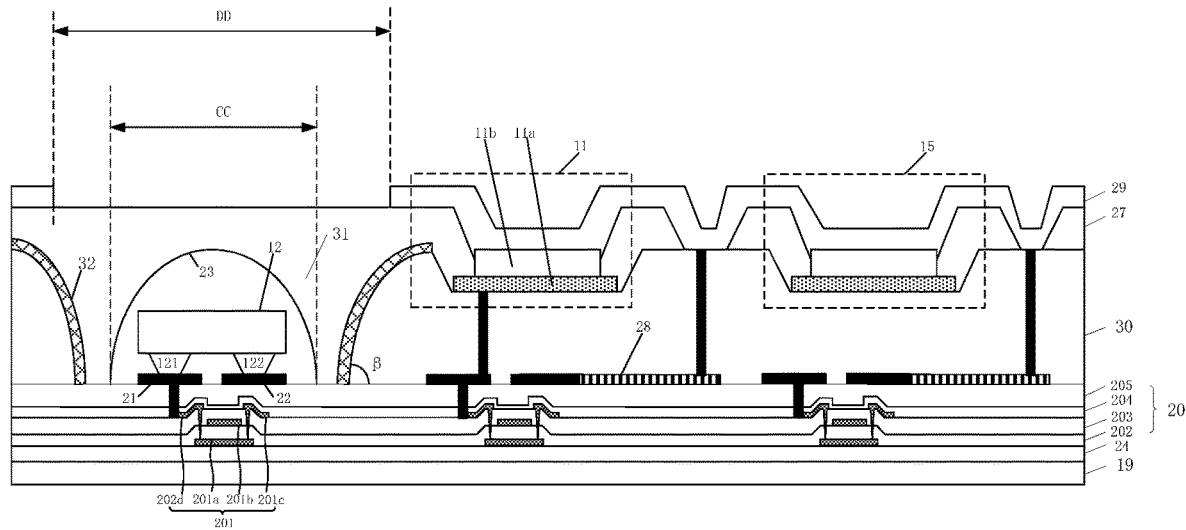
FIG. 16 illustrates a schematic cross-sectional view of another exemplary display panel consistent with disclosed embodiments of the present disclosure.

FIG. 16 illustrates a schematic cross-sectional view of another display panel consistent with disclosed embodiments of the present disclosure. In another embodiment, referring to FIG. 16, compared with the structure of the display panel shown in FIG. 15, the array layer 20 may be partially identical, and the film layer structure on the side of the array layer 20 away from the substrate 19 may be different.

Referring to FIG. 16, the display panel may further include a buffer layer 30 disposed on the side of the array layer 20 away from the substrate 19. The buffer layer 30 may include a first groove 31, and the second pixel 12 and the encapsulation structure 23 may be disposed in the first groove 31. A slope angle β of the sidewall of the first groove 31 may be in a range of approximately 15°-75°.

In one embodiment, after the second pixel 12 is transferred to the array layer 20, the patterned auxiliary cathode 28 may be formed on the side of the planarization layer 205 away from the substrate 19, and the auxiliary cathode 28 may be connected to the second electrode pad 22. Then, a buffer layer 30 made of a high refractive index material may be formed, and a process including but not limited to a halftone photolithography process may be performed on the buffer layer 30 to form the first groove 31 and a concave structure for forming the first pixel 11 and the third pixel 15. During the high-temperature post-baking process of the buffer layer 30 made of the high-refractive index material, the high-refractive index material may form the encapsulation structure 23 at the position of the second pixel 12 to encapsulate the second pixel 12. In one embodiment, the buffer layer 30 may be made of an organic material.

In one embodiment, referring to FIG. 16, the end of the encapsulation structure 23 away from the substrate 19 may be an arc surface, and the arc surface may be convex towards a direction away from the substrate 19. In other words, a lens-type encapsulation structure 23 may be formed to achieve the adjustment of the optical path of the light emitted from the second pixel 12, and to further improve the light-emitting efficiency of the second pixel 12.

In addition, during the high-temperature post-baking process of the buffer layer 30 made of the high-refractive index material, the slope angle β of the sidewall of the first groove 31 may be in a range of approximately 15°-75° by controlling the process parameters. In one embodiment, the slope angle β of the sidewall of the first groove 31 may be 55°.

Figure 17:
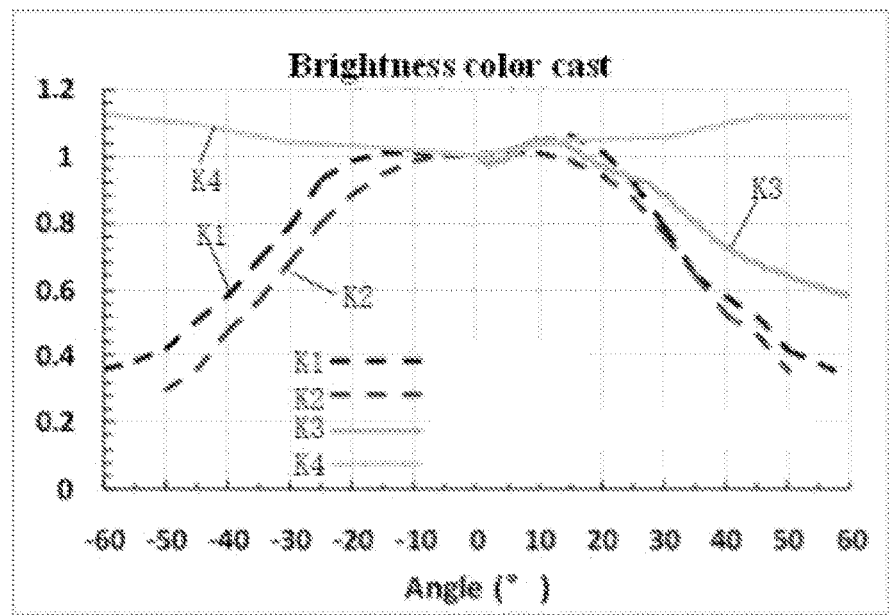
FIG. 17 illustrates a schematic diagram of a pixel brightness color cast of an exemplary display panel consistent with disclosed embodiments of the present disclosure.

FIG. 17 illustrates a schematic diagram of a pixel brightness color cast of a display panel consistent with disclosed embodiments of the present disclosure. Referring to FIG. 17, the abscissa may be a viewing angle, the ordinate may be a brightness, K1 may represent a change curve of the first pixel, K2 may represent a change curve of the third pixel, K3 may represent a change curve of the second pixel after providing the first groove, and K4 may represent a change curve of the second pixel. Referring to FIG. 17, the light-emitting brightness of the first pixel 11, the light-emitting brightness of the second pixel 12 and the light-emitting brightness of the third pixel 15 may be almost the same when the viewing angle is 0°. However, in a case where the first groove 31 is not formed, as the viewing angle changes, the light-emitting brightness of the second pixel 12 may increase, while the light-emitting brightness of the first pixel 11 and the light-emitting brightness of the third pixel 15 may decrease. To balance the light-emitting brightness of the first pixel 11, the second pixel 12 and the third pixel 15 at different viewing angles, in the disclosed embodiments, the first groove 31 may be provided and the slope angle β of the sidewall of the first groove 31 may be 55°, to achieve the adjustment of the light emitted from the second pixel 12, which may ensure that the changing trend of the light-emitting brightness of the first pixel 11, the second pixel 12 and the third pixel 15 may be the same when the viewing angle changes. In other words, referring to FIG. 17, when the viewing angle changes, the light-emitting brightness of the first pixel 11, the second pixel 12 and the third pixel 15 may decrease, to balance the brightness color cast of different pixels, thereby improving the display performance of the display panel.

The anode layer corresponding to the first pixel 11 and the third pixel 15 may be formed in the concave structure, and then the pixel defining layer 27 may be formed. The pixel defining layer 27 may include a plurality of openings for exposing the anode layer of the first pixel 11 and the third pixel 15.

Further, the light-emitting layers corresponding to the first pixel 11 and the third pixel 15 may be formed in the opening. The cathode layer 29 may be formed on the side of the pixel defining layer 27 away from the substrate 19. The anode layer may be connected to the first electrode pad 21 through a through-hole penetrating through the buffer layer 30. The cathode layer 29 may be connected to the auxiliary cathode 28 through a through-hole penetrating through the pixel defining layer 27 and the buffer layer 30, to achieve the connection between the cathode layer 29 and the second electrode pad 22, and to further achieve the connection between the cathode layer 29 and the thin film transistor 201.

Similarly, because the first pixel 11 and the third pixel 15 are quantum dot light-emitting units, to improve the light-emitting efficiency of the first pixel 11 and the third pixel 15, the coverage areas of the corresponding light-emitting layers may be substantially large. In the direction perpendicular to the plane of the display panel, the orthographic projection of the light-emitting layer on the plane of the display panel may at least partially cover the orthographic projection of the first electrode pad 21 on the plane of the display panel and the orthographic projection of the second electrode pad 22 on the plane of the display panel. Referring to FIG. 16, the orthographic projection of the light-emitting layer on the plane of the display panel may fully cover the orthographic projection of the second electrode pad 22 on the plane of the display panel. Therefore, in the disclosed embodiments, to achieve the connection between the second electrode pad 22 and the cathode layer 29, the auxiliary cathode 28 may be provided. In the direction perpendicular to the plane of the display panel, the orthographic projection of the anode layer on the plane of the display panel may at least partially overlap the orthographic projection of the auxiliary cathode 28 on the plane of the display panel. In other words, the auxiliary cathode 28 may be extended beyond a region of the opening, to achieve the connection with the cathode layer 29.

It should be noted that referring to FIG. 16, in the direction perpendicular to the plane of the display panel, the orthographic projection of the second pixel 12 on the display panel may not overlap the orthographic projection of the cathode layer 29 on the display panel, to ensure the light-emitting efficiency of the second pixel 12 and to prevent the cathode layer 29 from blocking the light emitted from the second pixel 12. The orthographic projection of the second pixel 12 on the display panel may be a region CC, and a region of the display panel except for the orthographic projection of the cathode layer 29 on the display panel, in other words, the region not covered by the cathode layer 29, may be a region DD.

A refractive index of the material of the encapsulation structure 23 may be greater than a refractive index of the material of the pixel defining layer 27. In one embodiment, the refractive index of the material of the encapsulation structure 23 may be greater than 1.67, and the refractive index of the material of the pixel defining layer 27 may be approximately 1.5. Through the film layer structures made of different refractive indices, the optical path of the light emitted from the second pixel 12 may be adjusted, thereby improving the light-emitting efficiency of the second pixel 12.

In another embodiment, referring to FIG. 16, a reflective layer 32 may be formed to cover the sidewall of the first groove 31, and the reflective layer 32 may include but may not be limited to a metal reflective layer. When the reflective layer 32 is a metal reflective layer, the reflective layer 32 may be formed in a same process as the anode layer.

The reflective layer 32 may be configured to reflect the light incident on the reflective layer 32 from the second pixel 12, to adjust the optical path of the light emitted from the second pixel 12, thereby improving the light-emitting efficiency of the second pixel 12.

In another embodiment, in a direction perpendicular to the plane of the display panel, a distance between the light-emitting layer of the first pixel 11 and the substrate 19 may be T1, and a distance between the light-emitting layer of the second pixel 12 and the substrate 19 may be T2, where T1=T2.

In the direction perpendicular to the plane of the display panel, a distance between the light-emitting layer of the third pixel 15 and the substrate 19 may be D3, where T1=T2=T3.

Through configuring the light-emitting layers of the first pixel 11, the second pixel 12 and the third pixel 15 on a same horizontal plane, the uniformity of light emitted from each pixel may be ensured, such that color cast may be prevented, and the display effect of the display panel may be improved.

Figure 18:
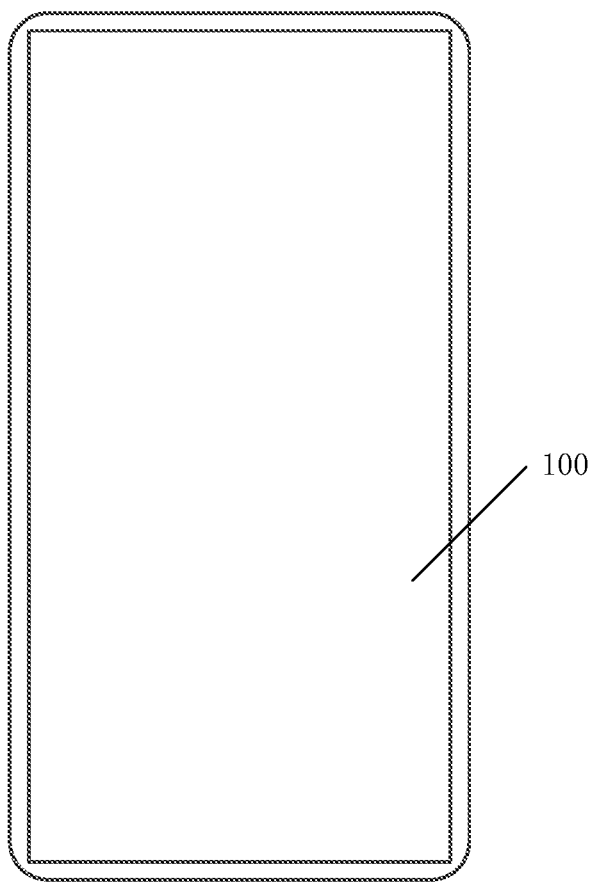
FIG. 18 illustrates a schematic diagram of an exemplary display device consistent with disclosed embodiments of the present disclosure.

The present disclosure also provides a display device. FIG. 18 illustrates a schematic diagram of a display device consistent with disclosed embodiments of the present disclosure. Referring to FIG. 18, the display device 100 may include the display panel described in the above disclosed embodiments.

The display device 100 may include but may not be limited to a mobile phone, a tablet, etc., and the display device may have at least the same technical effect as the display panel.

The display panel and the display device in the disclosed embodiments may have been introduced in detail. The principles and implementations of the present disclosure may be described with specific example. The descriptions of the above-disclosed embodiments may merely be used to facilitate understanding the present disclosure, which may not limit the scope of the present disclosure.

The various embodiments in the present disclosure are described in a progressive manner. Each embodiment mainly describes in terms of differences from other embodiments, and the same or similar parts between the various embodiments may be referred to each other.

It should be noted that the relational terms such as "first" and "second" are merely used to distinguish one entity or operation from another entity or operation, and do not necessarily require or imply any such actual relationship or sequence between these entities or operations. Moreover, the terms "include", "contain" or any variant may be intended to cover non-exclusive inclusion, such that a process, a method, an article, or a device that includes a series of elements may not only include such elements, but also include any other element that is not clearly listed, or may include elements inherent to such process, method, article or device. In a case without more restrictions, the element defined by the sentence "including . . . " may not exclude the existence of any other same element in the process, method, article, or device that includes the element.

The disclosed embodiments may have following beneficial effects. In the disclosed display panel, the pixel unit may include the first pixel circuit and the second pixel circuit. The orthographic projection of the first pixel circuit on the plane of the display panel may have an area smaller than the orthographic projection of the second pixel circuit on the plane of the display panel. In other words, the second pixel circuit may occupy a larger area in the pixel unit, and the first pixel circuit may occupy a smaller area in the pixel unit. Therefore, in the disclosed embodiments, two kinds of pixel circuits (e.g., the first pixel circuit and the second pixel circuit) that occupy different areas in the pixel unit may be used to drive different pixels. Compared with the method of driving all pixels by the second pixel circuit, the size of each pixel unit may be greatly reduced, thereby increasing the pixel arrangement density of the display panel.

In addition, in the direction perpendicular to the plane of the display panel, the light-emitting layer of the first pixel may at least partially overlap the second pixel circuit, and the light-emitting layer of the second pixel may at least partially overlap the second pixel circuit. In other words, in the direction perpendicular to the plane of the display panel, the second pixel circuit and the first pixel may share a partial region of the pixel unit, and the second pixel circuit and the second pixel may share another partial region of the pixel unit, thereby further reducing the size of each pixel unit and further improving the pixel arrangement density of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
   a plurality of pixels, wherein:
   a pixel of the plurality of pixels includes a light-emitting layer,
   the plurality of pixels include at least one first pixel and at least one second pixel,
   a first pixel of the at least one first pixel is electrically connected to a first pixel circuit, and a second pixel of the at least one second pixel is electrically connected to a second pixel circuit,
   an orthographic projection of the first pixel circuit on a plane of the display panel has an area smaller than an orthographic projection of the second pixel circuit on the plane of the display panel, and
   in a direction perpendicular to the plane of the display panel, a light-emitting layer of the first pixel at least partially overlaps the second pixel circuit, and a light-emitting layer of the second pixel at least partially overlaps the second pixel circuit,
   wherein the display panel further comprises:
   a substrate,
   an array layer, disposed on a side of substrate, wherein the first pixel and the second pixel are disposed on a side of the array layer away from the substrate, and
   an encapsulation structure, disposed on the side of the array layer away from the substrate, wherein the encapsulation structure is configured to encapsulate the second pixel.

2. The display panel according to claim 1, wherein:
   the first pixel includes a first light-emitting layer, wherein the first light-emitting layer is configured to emit red light or green light, and
   the second pixel includes a second light-emitting layer, wherein the second light-emitting layer is configured to emit blue light.

3. The display panel according to claim 2, further including:
   at least one third pixel, wherein:
   the first pixel and a third pixel of the at least one third pixel emit light with different colors, and
   the third pixel is electrically connected to a third pixel circuit, and an orthographic projection of the third pixel circuit on the plane of the display panel has an area smaller than the orthographic projection of the second pixel circuit on the plane of the display panel.

4. The display panel according to claim 3, wherein:
   in the direction perpendicular to the plane of the display panel, a light-emitting layer of the third pixel at least partially overlaps the second pixel circuit.

5. The display panel according to claim 2, wherein:
   each of the first pixel and the third pixel includes a quantum dot light-emitting unit, and
   the second pixel includes a light-emitting diode (LED) light-emitting unit.

6. The display panel according to claim 1, further including:
   at least one third pixel, and
   a plurality of pixel units, wherein:
   a third pixel of the at least one third pixel is electrically connected to a third pixel circuit, and an orthographic projection of the third pixel circuit on the plane of the display panel has an area smaller than the orthographic projection of the second pixel circuit on the plane of the display panel,
   a pixel unit of the plurality of pixel units includes one first pixel, one second pixel and one third pixel,
   along a first direction, the first pixel and the third pixel are disposed opposite to each other, and the second pixel is disposed between the first pixel and the third pixel, wherein the first direction is parallel to the plane of the display panel, and
   in the direction perpendicular to the plane of the display panel, an area of an orthographic projection of the first pixel on the plane of the display panel and an area of an orthographic projection of the third pixel on the plane of the display panel are larger than an area of an orthographic projection of the second pixel on the plane of the display panel.

7. The display panel according to claim 6, wherein:
   in the first direction, the second pixel at least partially overlaps the first pixel, and the second pixel at least partially overlaps the third pixel,
   in a second direction, the second pixel at least partially overlaps the first pixel, and the second pixel at least partially overlaps the third pixel, and
   the first direction intersects the second direction, and the second direction is parallel to the plane of the display panel.

8. The display panel according to claim 6, wherein:
   the plurality of pixel units are arranged in an array,
   in a column direction of the array, the pixel unit includes a first region and a second region that are disposed opposite to each other, and the first region and the second region are spaced apart by a gap, and
   the first pixel circuit and the third pixel circuit are disposed in the first region, and the second pixel circuit is disposed in the second region.

9. The display panel according to claim 8, further including:
   a first gate driving circuit and a second gate driving circuit, and a first side and a second side that are opposite to each other in a row direction of the array, wherein:
the first gate driving circuit is disposed on the first side and is electrically connected to the second pixel circuit, and
the second gate driving circuit is disposed on the second side and is electrically connected to the first pixel circuit and the third pixel circuit.

10. The display panel according to claim 1, wherein:
in the direction perpendicular to the plane of the display panel, a distance between a light-emitting layer of the first pixel and the substrate is T1, and a distance between a light-emitting layer of the second pixel and the substrate is T2, wherein T1=T2.

11. The display panel according to claim 1, further including:
a buffer layer, disposed on the side of the array layer away from the substrate, wherein:
the buffer layer includes a first groove, and the second pixel and the encapsulation structure are disposed in the first groove, and
a slope angle of a sidewall of the first groove is in a range of approximately 15°-75°.

12. The display panel according to claim 11, wherein:
an end of the encapsulation structure away from the substrate is an arc surface, and
the arc surface is convex towards a direction away from the substrate.

13. The display panel according to claim 11, further including:
a pixel defining layer, disposed on a side of the buffer layer away from the substrate, wherein in the direction perpendicular to the plane of the display panel, the pixel defining layer covers the encapsulation structure, and the encapsulation structure is made of a material having a refractive index greater than the pixel defining layer.

14. The display panel according to claim 1, wherein:
the first pixel includes an anode layer, and a cathode layer disposed on a side of the anode layer away from the substrate,
the display panel further includes an auxiliary cathode disposed between the anode layer and the substrate, wherein the auxiliary cathode is at least connected to the cathode layer, and
in the direction perpendicular to the plane of the display panel, an orthographic projection of the anode layer on the plane of the display panel partially overlaps an orthographic projection of the auxiliary cathode on the plane of the display panel.

15. The display panel according to claim 14, wherein:
in the direction perpendicular to the plane of the display panel, the cathode layer does not overlap with the second pixel.

16. A display panel, comprising:
a plurality of pixels, wherein:
a pixel of the plurality of pixels includes a light-emitting layer,
the plurality of pixels include at least one first pixel, at least one second pixel, and at least one third pixel,
a first pixel of the at least one first pixel is electrically connected to a first pixel circuit, and a second pixel of the at least one second pixel is electrically connected to a second pixel circuit,
an orthographic projection of the first pixel circuit on a plane of the display panel has an area smaller than an orthographic projection of the second pixel circuit on the plane of the display panel, and
in a direction perpendicular to the plane of the display panel, a light-emitting layer of the first pixel at least partially overlaps the second pixel circuit, and a light-emitting layer of the second pixel at least partially overlaps the second pixel circuit; and
a plurality of pixel units, wherein:
a third pixel of the at least one third pixel is electrically connected to a third pixel circuit, and an orthographic projection of the third pixel circuit on the plane of the display panel has an area smaller than the orthographic projection of the second pixel circuit on the plane of the display panel,
a pixel unit of the plurality of pixel units includes two first pixels, one second pixel and two third pixels,
centers of the two first pixels and centers of the two third pixels form a virtual quadrilateral, and
the second pixel is located within the virtual quadrilateral and covers a geometric center of the virtual quadrilateral.

17. The display panel according to claim 16, wherein:
a line connecting the centers of the two first pixels form a side of the virtual quadrilateral, or
a line connecting the centers of the two first pixels form a diagonal of the virtual quadrilateral.

18. The display panel according to claim 16, wherein:
the first pixel circuit includes a driving module, and the driving module is configured to provide a driving current for the two first pixels,
the first pixel circuit further includes a first switch module and a second switch module,
a first terminal of the first switch module is electrically connected to an output terminal of the driving module, and a first terminal of the second switch module is electrically connected to the output terminal of the driving module, and
a second terminal of the first switch module is connected to a $1^{st}$ first pixel, and a second terminal of the second switch module is connected to a $2^{nd}$ first pixel.

19. The display panel according to claim 16, further including:
a substrate,
an array layer, disposed on a side of substrate,
the first pixel and the second pixel, disposed on a side of the array layer away from the substrate, and
an encapsulation structure, disposed on the side of the array layer away from the substrate, wherein the encapsulation structure is configured to encapsulate the second pixel.

20. A display device, comprising:
a display panel, the display panel including:
a plurality of pixels, wherein:
a pixel of the plurality of pixels includes a light-emitting layer,
the plurality of pixels include at least one first pixel and at least one second pixel,
a first pixel of the at least one first pixel is electrically connected to a first pixel circuit, and a second pixel of the at least one second pixel is electrically connected to a second pixel circuit,
an orthographic projection of the first pixel circuit on a plane of the display panel has an area smaller than an orthographic projection of the second pixel circuit on the plane of the display panel, and
in a direction perpendicular to the plane of the display panel, a light-emitting layer of the first pixel at least partially overlaps the second pixel circuit, and a light-emitting layer of the second pixel at least partially overlaps the second pixel circuit,
wherein the display panel further comprises:
  a substrate,
  an array layer, disposed on a side of substrate, wherein the first pixel and the second pixel are disposed on a side of the array layer away from the substrate, and
  an encapsulation structure, disposed on the side of the array layer away from the substrate, wherein the encapsulation structure is configured to encapsulate the second pixel.

* * * * *